(12) United States Patent
Yamada et al.

(10) Patent No.: US 6,271,619 B1
(45) Date of Patent: Aug. 7, 2001

(54) PIEZOELECTRIC THIN FILM DEVICE

(75) Inventors: Akira Yamada; Chisako Maeda; Toshio Umemura; Fusaoki Uchikawa; Koichiro Misu; Shusou Wadaka; Takahide Ishikawa, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/423,538
(22) PCT Filed: May 13, 1997
(86) PCT No.: PCT/JP97/01602
§ 371 Date: Nov. 12, 1999
§ 102(e) Date: Nov. 12, 1999
(87) PCT Pub. No.: WO98/52280
PCT Pub. Date: Nov. 19, 1998

(51) Int. Cl.[7] .................................................... H01L 41/04
(52) U.S. Cl. ............................................................ 310/324
(58) Field of Search ..................................... 310/330, 324

(56) References Cited

U.S. PATENT DOCUMENTS 5,801,476 * 9/1998 Sturzebecher et al. .............. 310/324
5,814,920 * 9/1998 Takeuchi et al. .................... 310/330

FOREIGN PATENT DOCUMENTS

| 60-68710 | 4/1985 | (JP) | H03H/9/05 |
| 62-81807 | 4/1987 | (JP) | H03H/9/17 |
| 62-266906 | 11/1987 | (JP) | H03H/9/15 |
| 2-162817 | 6/1990 | (JP) | H03H/9/24 |
| 8-186467 | 7/1996 | (JP) | H03H/9/17 |
| 98/52280 | 11/1998 | (WO) | H03H/9/17 |

* cited by examiner

Primary Examiner—Elvin Enad
Assistant Examiner—Peter Medley
(74) Attorney, Agent, or Firm—Sughrue, Mion, Zinn, Macpeak & Seas, PLLC

(57) ABSTRACT

A piezoelectric thin film device which is composed mainly of a substrate, a piezoelectric thin film formed on the substrate, and thin film electrodes formed on both the upper and lower surfaces of the thin film. The thin film is resonated by applying an AC voltage across the electrodes. A substrate removed section is formed by partially or entirely removing the substrate below the thin film and opened to both the front and rear surfaces of the substrate through openings so as to relieve the pressure variation in the substrate removed section below a resonant structure.

9 Claims, 5 Drawing Sheets

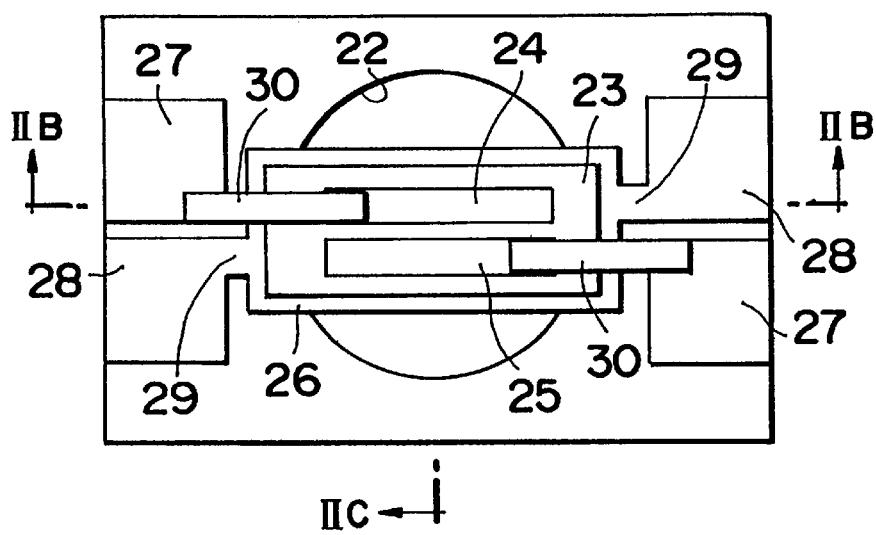
Fig. 2A
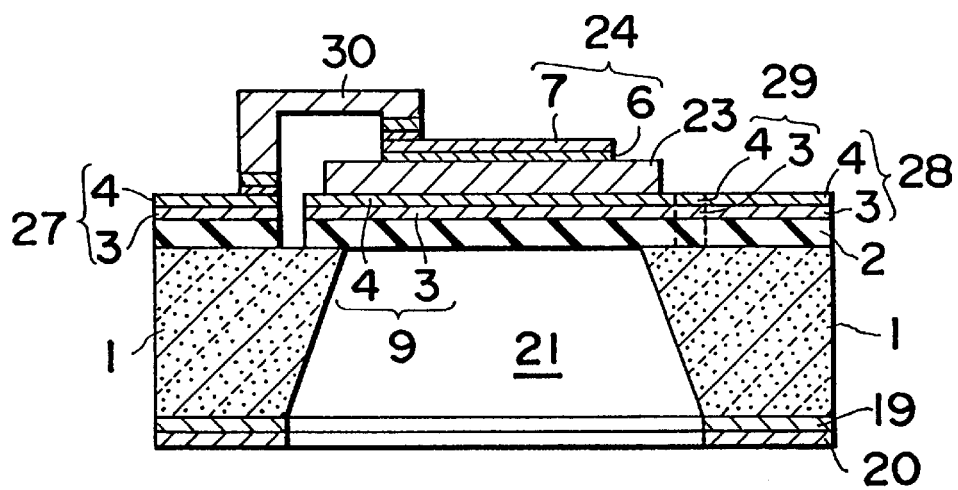
Fig. 2B
Fig. 2C

PIEZOELECTRIC THIN FILM DEVICE

FIELD OF THE INVENTION

The present invention relates to a piezoelectric thin film device with good production yield and reliability, in particular, to a piezoelectric thin film device which has a floating structure having openings in a surface of a substrate and is suitably used at a high frequency.

BACKGROUND ART

A piezoelectric thin film device is a device, which uses a bulk resonance of a piezoelectric film, for use as a filter or a resonator capable of activation in a certain frequency ranging from several hundreds Mega-Hertz to Giga-Hertz. Likewise, the resonator is used in a crystal oscillator; however, it is activated at lower frequency. When the piezoelectric thin film device is used in communication instruments for a mobile communication, for example, a frequency to be used is considerably high and ranges from several hundreds Mega-Hertz to Giga-Hertz.

For a device which uses a bulk resonance of the piezoelectric film, a resonance frequency of the film is mainly determined by a thickness of the piezoelectric film, so that the thickness is needed to be reduced to several micro-meters or less in order to resonate the film with frequency of Giga-Hertz. The crystal oscillator mentioned above is made by polishing a single crystal, thereby it is difficult to thin the oscillator up to about several micro-meters.

Recently, devices using the bulk resonance has been studied actively, in which piezoelectric thin films thinned up to about 1 to 2 μm by various thin film fabrication method are typically used. Also, thin film electrodes formed on both sides of the piezoelectric thin film is applied with AC voltage for resonating the film. Also, in order to decrease an energy loss of a resonation, employed is a floating structure in which a portion positioned under resonant section of the film is partly etched.

One well-known method for fabricating the floating structure has fabricating an upper structure on a gallium arsenide (GaAs) substrate, etching the substrate from its bottom using an etchant such as sulfuric acid. For example, JP(A) 6-350154 discloses one fabrication method in which the floating structure is fabricated by forming an insulating film, a lower thin film electrode, a piezoelectric thin film, and an upper thin film electrode successively on surface of a substrate, and etching a part of the substrate from its opposite surface to the insulating film to form a floated resonant section on the etched part. The floating structure mentioned above can be fabricated using relatively simple processes.

However, the etched part or recess formed in the bottom surface of the substrate is closed at its top by the insulating film. Therefore, when the structure is mounted on a substrate with its bottom surface fixed to the substrate using an adhesive, the recess is disadvantageously closed. As a result, a pressure in the closed recess varies considerably at the vibration of the resonant section, which results in damages of the. device and a decrease in its reliability.

Also, a wire connected to the upper electrode is provided on the piezoelectric thin film and, in this instance, it should be extended over a step caused by the existence of the piezoelectric thin film, which may cause a disconnection of the wire and an increase of parasitic capacitance.

Also, the recess of the structure decrease the strength of the resonant section in particular as well as the yield of the device.

SUMMARY OF THE INVENTION

The first object of the present invention is to provide a piezoelectric thin film device having a floating structure with a high durability and reliability.

The second object of the present invention is to reinforce a structure of a resonant section and thereby to prevent the device from being damaged, increasing a production yield and reliability of the device.

The piezoelectric thin film device of the present invention mainly comprises a substrate, an insulating film formed on the substrate, a piezoelectric thin film formed on the insulating film, and thin film electrodes formed on both upper and lower surfaces of the piezoelectric thin film, wherein the piezoelectric thin film resonated by an application of alternating voltage between the thin film electrodes, characterized in that the substrate below the piezoelectric thin film is partially or entirely removed to form a removed section, so that the removed section is opened air at top and bottom surfaces of the device.

That is, one of the feature of the present invention is that the removed section below the piezoelectric thin film is opened to air at top and bottom surface of the device through corresponding opening. Therefore, the removed section does not define a closed space even when it is mounted and fixed on a substrate, so that the piezoelectric thin film is prevent from being damaged by the pressure variation which would otherwise be caused if the removed section is not opened to air at the top surface of the device.

A substrate may be made of any material to which etching can be applicable, such as a semiconductor (e.g., Si, GaAs) and an oxide (e.g., MgO). The insulating film, which is not needed when the substrate has a significant high insulation resistance, may be selected from materials having a chemical stability against the etchant used for an etching of the substrate, for example, silicon oxide (SiO, $SiO_2$), silicon nitride (SiNx), tantalum oxide (TaOx), strontium titanate ($SrTiO_3$), and magnesium oxide (MgO) etc.

Preferably, the thin film electrode below the piezoelectric thin film may be made of materials having a good adhesion property to the substrate and the insulating film and being stable to the piezoelectric thin film, such as noble metal (e.g., Pt, Au), multi-layer material consist of noble metal and titanium (Ti), ruthenium oxide ($RuO_2$), or iridium oxide ($IrO_2$) etc. Alternatively, when the piezoelectric thin film is formed at relatively lower temperature, for example, 300° C. or less, aluminum may be used.

The piezoelectric thin film may be made of any piezoelectric thin film, for example, zinc oxide (ZnO), aluminum nitride (AlN), lead titanate ($PbTiO_3$), lead zirconate titanate ($Pb(Zr,Ti)\ O_3$),and lithium niobate ($LiNbO_3$).

The thin film electrode on the piezoelectric thin film is not subjected to high temperature and therefore may be made of any above mentioned materials.

Note that, the above mentioned structure having an opening on its top surface can prevent the device from being damaged by the pressure variation. However, the mechanical strength of the resonant section is insufficient. The mechanical strength, on the other hand, can be increased by increasing the thickness of the insulating film formed on the substrate, which in turn results in that the piezoelectric thin film is resonated with the thick and heavy insulating film, decreasing an efficiency of the resonance. It is therefore needed for the resonate structure to be light in order to keep the resonance of the structure and to be held positively.

Inventors of the present invention found that it is effective making a bridge between the resonant section above the removed section and the substrate in order to reinforce the resonant section. And the present invention is completed.

That is, the piezoelectric thin film device of the present invention includes at least one bridge supported at one end thereof on at least the piezoelectric thin film, the thin film electrode, or an insulating film formed between the substrate and the piezoelectric thin film and at the other end thereof on at least a portion of the substrate outside the recess, wherein the portion to be resonated is supported by the bridge.

The reinforcing structure is useful for the device having a recess opened to air at one surface of the substrate. This in turn means the structure is effective to the device which has a recess opened at the top surface of the substrate but closed at its bottom surface.

That is, a piezoelectric thin film device, comprising: a substrate; a piezoelectric thin film formed on the substrate; and thin film electrodes formed on the upper and lower surfaces of the piezoelectric thin film, wherein an alternating voltage is applied across the thin film electrodes to resonance the portion of the piezoelectric thin film, and wherein a portion of the substrate under the dielectric thin film is partially or entirely removed to form a recess, the recess being opened to air at an top surface of the substrate, and further comprising at least one bridge supported at one end thereof on at least the piezoelectric thin film, the thin film electrode, or an insulating film formed between the substrate and the piezoelectric thin film and at the other end thereof on at least a portion of the substrate outside the recess, wherein the portion to be resonated is supported by the bridge can be provided according to the present invention.

With the arrangement, where the bridge is made of electrically conductive material and then each of the electrodes is electrically connected with the corresponding communication line or wire on the substrate, the resonant structure can also be used for the communication lines or wires. Also, a possible disconnection will be prevented for the line extending across steps caused on the piezoelectric thin film. Further, a parasitic capacity due to the surface wiring will be decreased, which is useful to a designing of the device. Therefore, where the bridge is used for the communication wire, it is preferably made of suitable material such as gold (Au), copper (Cu), aluminum (Al), and nickel (Ni). If otherwise, other metals can preferably used instead.

The bridge on the resonate structure can be positioned on the piezoelectric thin film, electrode, or insulating film. When forming a plurality of bridges, they may preferably be arranged symmetrically.

BRIEF DESCRIPTION OF DRAWINGS

FIG. 2A is a plane view of a piezoelectric thin film device according to the second example of the present invention.

FIG. 2B is a cross sectional view along with IIB—IIB.

FIG. 2C is a cross sectional view along with IIC—IIC.

DESCRIPTION OF THE PREFERRED EMBODIMENTS

Several examples or embodiments according to the invention will be described in detail below.

EXAMPLE 1

Figure 1A:
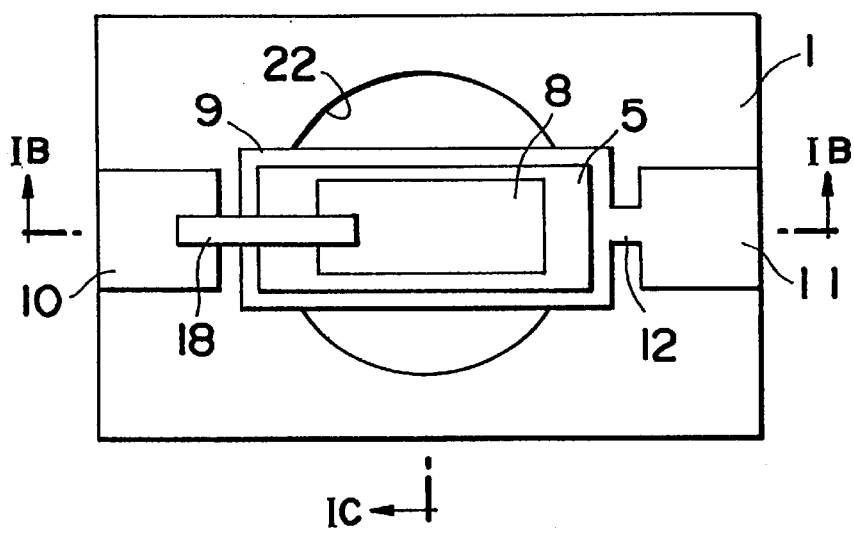
FIG. 1A is a plane view of a piezoelectric thin film device according to the first example of the present invention.
Figure 1B:
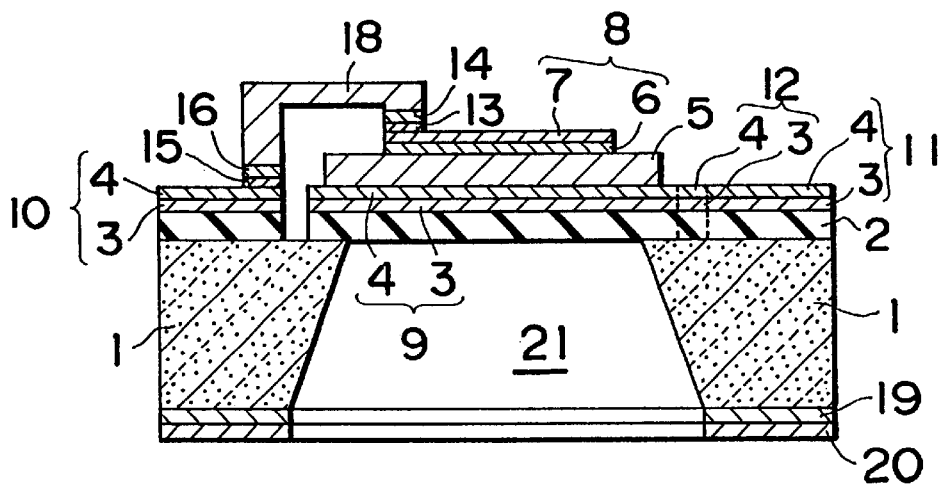
FIG. 1B is a cross sectional view along with 1B—1B.
Figure 1C:
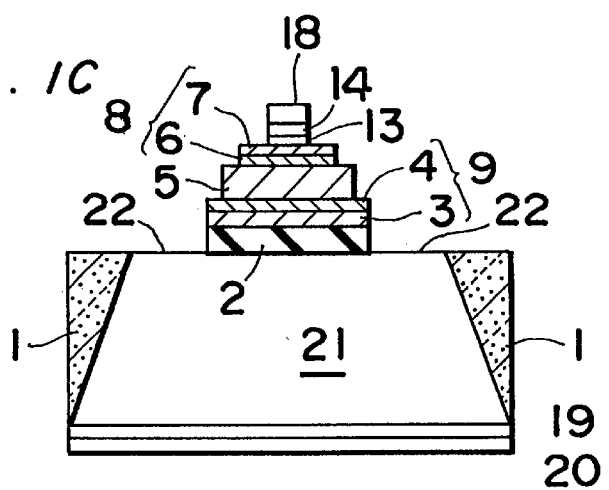
FIG. 1C is a cross sectional view along with IC—IC.

FIGS. 1A, 1B and 1C show a first example or embodiment of a device according to the present invention. Provided was a substrate (1) made of <100 > gallium arsenide (GaAs). An insulating film (2) made of silicon dioxide film having a thickness of about 200 nm was formed on the substrate (1). The insulating film (2) was formed by plasma CVD (Chemical Vapour Deposition) method using reactive gas having silane gas and oxygen gas at 300° C. A lower electrode thin film having of 2-layers structure of a titanium film (3) of 30 nm in thickness and platinum film (4) of 70 nm in thickness was formed on the insulating film (2) by an evaporation method. A piezoelectric thin film (5) about 2 $\mu$m in thickness having aluminum nitride formed on the lower electrode thin films (3,4). The piezoelectric thin film (5) was formed by sputtering method using a target of aluminum and mixing gas consisting of argon gas and nitrogen gas under the condition of 1 Pa in pressure, with keeping the substrate at 300° C.

Further, a titanium film (6) and platinum film (7), which have the same composition as the lower electrode thin films (3,4), respectively, were formed by the same evaporation method as that used for the formation of the film (3,4), and then an upper thin film electrode (8) is deposited by using lift-off method. Subsequently, a part of the piezoelectric thin film was etched and removed by an ion milling method using a suitable resist mask, so that the piezoelectric thin film (5) was formed into the shape of 200 $\mu$m×100 $\mu$m. Further, the lower electrode thin films (3,4) were patterned by ion milling method, so that a lower thin film electrode (9) of 250 $\mu$m×150 $\mu$m was formed. Simultaneously, a connectors (12) were made between the lower thin film electrode (9) and the lower electrode pad (11) on a portion of the substrate (1) outside the piezoelectric thin film.

A portion of the insulating film (2) outside the metal film was removed by ion milling method. Subsequently, a resist was provided and then a titanium films (13,15) and an gold films (14,16) were formed alternately on the upper thin film electrode and the upper thin film electrode pad, so that bases of a bridge were formed. Subsequently, an gold plating layer was formed and then the resist was removed, so that the bridge (18) was formed between the upper thin film electrode (8) and the upper thin film electrode pad (10), completing the formation of the upper structure.

A glass plate was fixed using a wax on the top surface of the substrate (1) on which the upper structure has been formed, and then the substrate (1) was polished to reduce the thickness of the substrate to about 100 $\mu$m. Subsequently, a titanium film (19) was formed by an evaporation method and an gold film (20) was formed by evaporation method and plating method, so that a mask for removing a section of the substrate (1) supporting the upper thin film electrode (8) and the piezoelectric thin film (5). Then, the substrate (1) was partially removed from its bottom surface by anisotropic etching method using sulfuric acid, forming a removed section (21).

The substrate removed section (21) was in the shape of ellipse when viewed from its above. The substrate (1) was etched so that the largest diameter of the removed section (21) in the insulating film (2) became longer than a shorter side of the lower thin film electrode (9) which is 150 μm in length, thereby forming an opening (22) on the front surface of the substrate (1). As described above, the piezoelectric thin film device of the floating structure, having an opening (22) which connected the top and bottom surfaces of the substrate, was fabricated.

This device was fixed in a package in order to determine the electric characteristics of the device and then tested. As a result, seven percent of the devices were damaged through several measurements.

EXAMPLE 2

FIGS. 2A, 2B and 2C show another example or embodiment of the device according to the present invention. The same processes used for the first example have been provided before the formation of the lower electrode thin films (3, 4). Then, the lower electrode thin films (3, 4) were coated with a piezoelectric thin film (23) of lead titanate, having a thickness of about 1 μm. The piezoelectric thin film (23) was deposited by the sputtering using a gas mixture of argon and oxygen gases and a lead titanate target containing of lead in excess of 20 mol % under the condition of 1Pa in pressure with keeping the substrate at 600° C. Further, a metal films (6,7), having the same compositions as the lower electrode thin films (3,4), respectively, were deposited by the same method as that used for the formation of the films (3,4) by the evaporation. Then, two upper thin film electrodes (24,25) were made on the piezoelectric thin film (23) by using the lift-off method. Subsequently, after applying a resist mask on a part of the piezoelectric thin film, the remaining part of the piezoelectric thin film was etched using the mixed etchant of hydrochloric acid and nitric acid at 70° C. into a rectangular of 200 μm×100 μm.

Further, the lower electrode thin films (3,4) were patterned by the ion milling to form the lower thin film electrode (26) of 250 μm×150 μm in size. In this process, a connectors (29) is also formed between the lower thin film electrode (26) and the lower electrode pad (28), on the substrate (1) outside the piezoelectric thin film (23). A part of the insulating film (2) outside the region of the metal film was removed by the ion milling.

Subsequently, a bridge (30) is formed between the upper thin film electrodes (24,25) and the upper thin film electrode pad (27) as described in the first example, completing the upper structure. Further, the substrate (1) was etched from its bottom surface as described in the first example to form a recess (21), so that the floating type of piezoelectric thin film device having an opening (22) which connects the top and bottom surfaces of the substrate was fabricated.

The devices were fixed in a package to evaluate their electric features. In this evaluation, seven percent of the devices were broken.

EXAMPLE 3

FIGS. 2A, 2B and. 2C show a device of the third example or embodiment according to the present invention. The lower electrode thin film (3,4) were formed through processes described in the first embodiment, except that the insulating film (2) was made of silicon nitride and having a thickness of about 200 nm. The insulating film (2) was formed by the plasma CVD method using a reactive gas of silane and ammonia at 300° C.

The piezoelectric thin film (23) of zinc oxide having a thickness of about 2 μm was formed on the lower electrode thin films (3,4). The piezoelectric thin film (23) was formed by the sputtering using a mixing gas of argon and oxygen and a zinc target under the condition of 1 Pa with keeping the substrate at 600° C. Following processes were the same as those in the first example. Thereby, the floating type of piezoelectric thin film device with the opening (22) which connects the top and bottom surfaces of the substrate was fabricated.

The devices were fixed in a package to evaluate their electric features. In this evaluation, seven percent of the devices were broken.

EXAMPLE 4

Figure 3A:
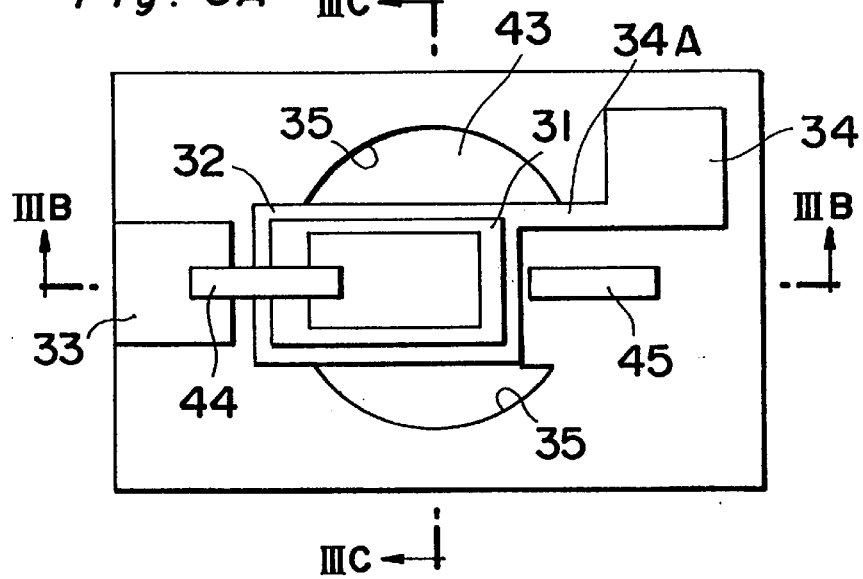
FIG. 3A is a plane view of a piezoelectric thin film device according to the fourth example of the present invention.
Figure 3B:
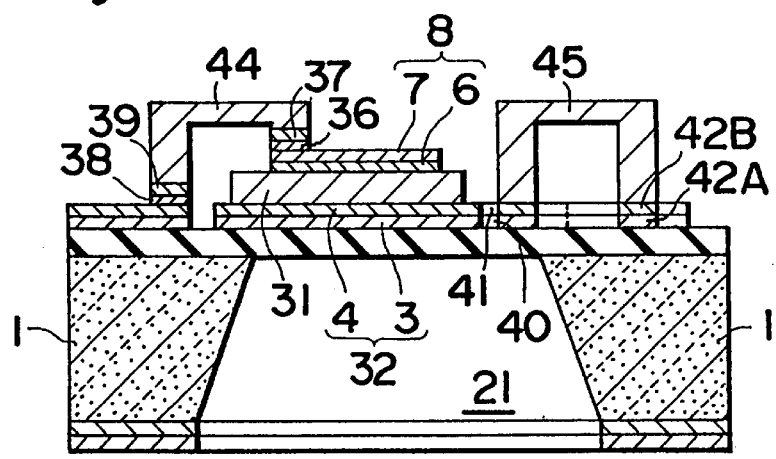
FIG. 3B is a cross sectional view along with IIIB—IIIB.
Figure 3C:
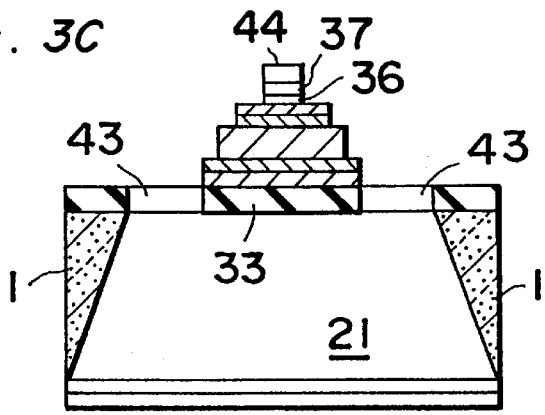
FIG. 3C is a cross sectional view along with IIIC—IIIC.

FIGS. 3A, 3B and 3C show a device of the third example or embodiment according to the present invention. Processes employed before the formation of the upper thin film electrode (8) were the same as those for the first example. Then, using a suitable resist mask, a portion of the piezoelectric thin film (31) was removed by the ion-milling to shape it into a size of 200 μm×150 μm. Further, the lower electrode thin films (3,4) were patterned by the ion-milling to form the lower thin film electrode (32) having a rectangular configuration of 250 μm×150 μm. Also, connectors (34A) are formed between the lower thin film electrode (32) and the lower electrode pad (34) on the substrate (1) outside the piezoelectric thin film (31). Subsequently, a hole (43) was formed in the insulating layer (2), which would be opened afterwards at the top surface of the substrate (1). In addition, a resist was applied, and then a titanium film (36,38) and an gold film (37,39) were formed on the upper thin film electrode (8) and the upper thin film electrode pad (33), forming bases of a bridge. Further, a titanium film (40,42A) and an gold film (41,42B) were formed on the insulating film (2) positioned on the recess (21) as well as on the insulating film (2), forming bases of a bridge is formed. Subsequently, an gold plating was applied and then the resist was removed. This resulted in bridges (44,45) between the upper thin film electrode (8) and the upper electrode pad (33), and between the insulating film (2) removed section (21) and the insulating film (2), respectively, which completed the formation of the upper structure. Subsequently, a recess was formed in the substrate as described in the first embodiment, thereby completing the piezoelectric thin film device having an opening (43) which connects between the top and bottom surfaces of the substrate.

The devices were fixed in a package to evaluate their electric features. In this evaluation, five percent of the devices were broken.

EXAMPLE 5

Figure 4A:
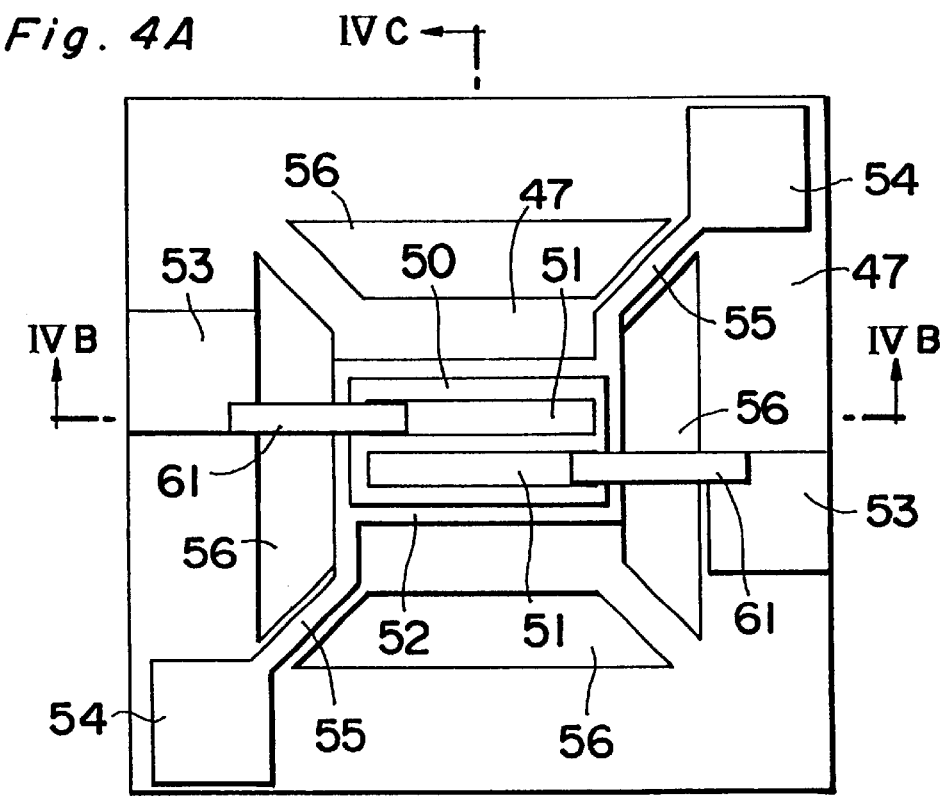
FIG. 4A is a plane view of a piezoelectric thin film device according to the fifth example of the present invention.
Figure 4B:
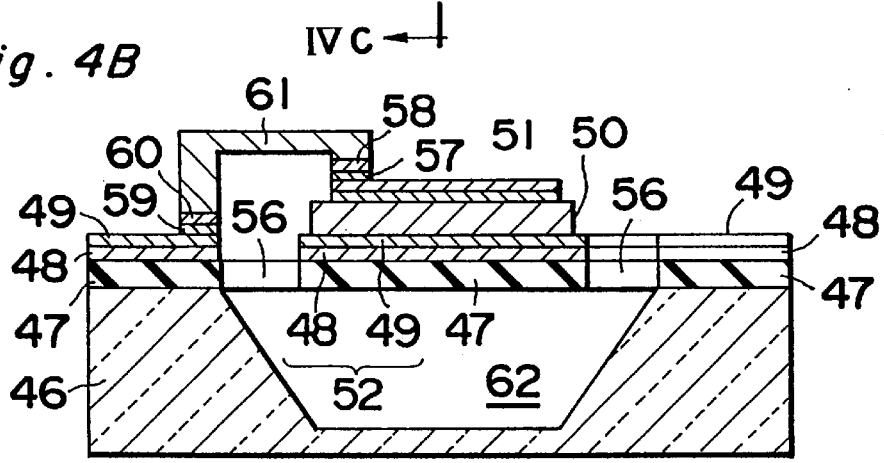
FIG. 4B is a cross sectional view along with IVB—IVB.
Figure 4C:
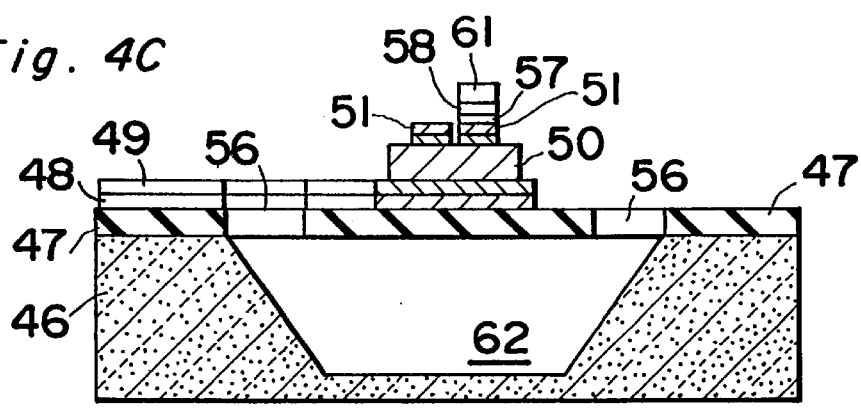
FIG. 4C is a cross sectional view along with IVC—IVC.

FIGS. 4A, 4B and 4C show a device of the third example or embodiment according to the present invention. A substrate (46) made of <100> silicon is coated at its top surface with an insulating film (47) made of silicon nitride, having a thickness of about 200 nm. The silicon nitride film (47) was formed by the plasma CVD using a reactive gas of silane and ammonia, at 300° C. A lower electrode thin film with a double-layer structure of a titanium film (48) of 30 nm in thickness and platinum film (49) of 70 nm in thickness was formed on the insulating film (47) by the evaporation. Further, a piezoelectric thin film (50) of lead titanate 1 μm in thickness is formed on the lower electrode thin film (48,49). The piezoelectric thin film (50) was formed by the sputtering using a mixed gas of argon and oxygen and a lead titanate target which includes lead excessively by 20 mol % under the condition of a pressure of 1 Pa with keeping the temperature of the substrate at 600° C.

A metal film having the same composition as the lower electrode thin film (48,49) was deposited by the use of the same processes as those used for the formation of the lower electrode thin film (48,49). Then, two upper thin film electrodes (51) were formed by the lift-off. Further, using a suitable resist mask, the piezoelectric thin film (50) was etched with a mixture of hydrochloric acid and nitric acid at 70° C. into a rectangular shape of 150 μm×100 μm. Then, the lower electrode thin film (48,49) patterned by the ion milling to form a lower thin film electrode (52) of 170 μm×120 μm. Simultaneously, connectors (55) are defined between the lower thin film electrode (52) and the lower electrode pad (54) on the substrate (1) outside the piezoelectric thin film.

Subsequently, the insulating film was formed by the ion-milling with an opening (56) to be used as an etching hole for removing a portion of the substrate. Then, after the formation of a resist, a titanium film (57,59) and an gold film (58,60) to be used as bases of a bridge were formed on the upper thin film electrode (51) and the upper thin film electrode pad (53) for bases of a bridge. After the gold plating, the resist was removed to form the bridge (61) between the upper thin film electrode (51) and the upper thin film electrode pad (53). This completed the formation of the upper structure. The substrate carrying the upper structure so formed was dipped in a 5 wt % KOH solution at 70° C. for about one hour, so that a portion of the silicon substrate (46) under the piezoelectric thin film (50) was unisotropically etched from the opening (56) to form a recess (62) and thereby the floating structure.

The devices were fixed in a package to evaluate their electric features. In this evaluation, seven percent of the devices were broken.

COMPARATIVE EXAMPLE 1

Figure 5A:
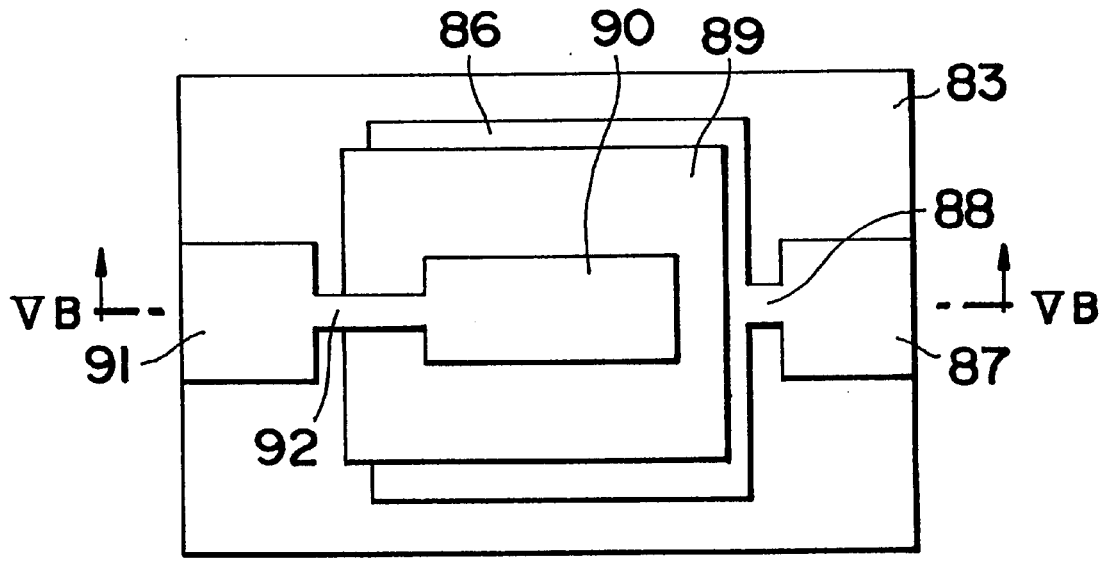
FIG. 5A is a plane view of a piezoelectric thin film device according to the comparative example.
Figure 5B:
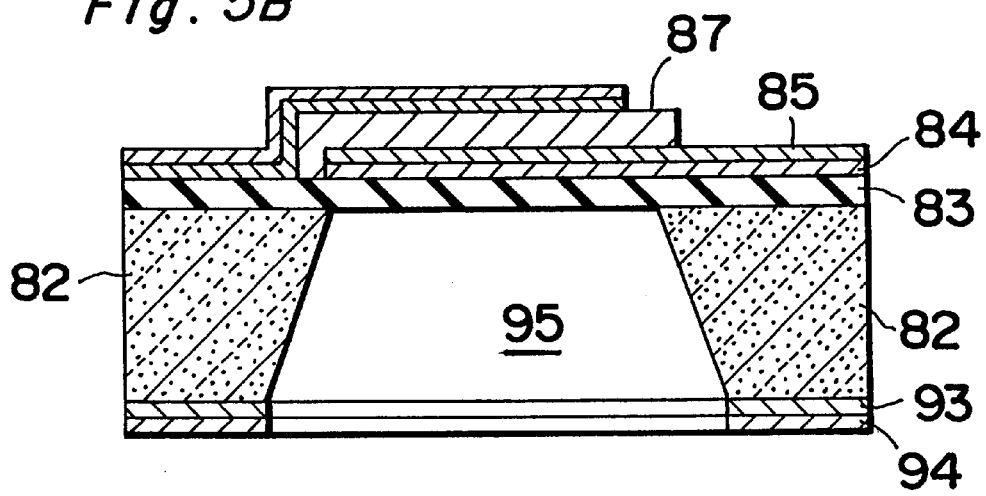
FIG. 5B is a cross sectional view along with VB—VB.

FIGS. 5A and 5B show a device of a comparative example. A substrate (82) made of <100> gallium arsenide (GaAs) was coated with an insulating film (83) of silicon dioxide. The silicon dioxide film (83) was formed by the plasma CVD using a reactive gas of silane and oxide at 300° C. A lower electrode thin film in a double-layer structure of a titanium film (84) of 30 nm in thickness and platinum film (85) of 70 nm in thickness was formed on the insulating film (83) by the evaporation. The lower electrode thin film was patterned by the lift-off to form a lower thin film electrode (86). Simultaneously, an electrical connection (88) was formed between the lower electrode pad (87) and the lower thin film electrode (86) on the substrate (82) outside a region for a piezoelectric thin film.

The piezoelectric thin film (89) of aluminum nitride of about 2 μm in thickness was formed on the lower thin film electrode (86). The piezoelectric thin film (89) was formed by the sputtering using a mixture of argon and nitrogen under the pressure of 1 Pa in pressure with keeping the temperature of the substrate at 300° C. A portion of the piezoelectric thin film (89) was etched by the ion milling using a resist mask into a rectangular shape of 200 μm×200 μm.

Further, a metal film having the same composition as the lower electrode thin film (86) was deposited by the use of the same processes as those used for the formation of the lower electrode thin film (86). Then, an upper thin film electrode (90) was formed by the lift-off. Simultaneously, an electric connection (92) to the upper electrode pad (91) was formed on the substrate (82) outside a piezoelectric thin film (89).

A glass plate was fixed using a wax on the upper surface of the substrate supporting the upper structure, and then the substrate was polished to reduce its thickness down to about 100 μm. Subsequently, a titanium film (93) was formed by the evaporation and a gold film (94) was formed by the evaporation and plating, so that a mask was formed for removing a portion of the substrate (82) under the upper thin film electrode (90) and piezoelectric thin film (89). Then, the substrate was removed from its bottom surface by the anisotropic etching method using sulfuric acid to form a recess (95). As described above, a floating type of piezoelectric thin film device having an opening only in the bottom surface of the substrate was formed.

The devices were fixed in a package to evaluate their electric features. In this evaluation, twenty five percent of the devices were broken.

Industrial Applicability

According to the present invention, a pressure variation is released under the resonate portion at the production and handling process of the piezoelectric thin film device. Besides, the resonate portion is reinforced. This will prevent the device from being damage at its production and handling process, increasing its yield, reliability, and manufacturing cost.

Also, the piezoelectric device will reduce a size and cost of a communication system and various instruments used in such system, for example, filter, resonator, and voltage control transmitter.

What is claimed is:

1. A piezoelectric thin film device, comprising:
   a substrate having a top surface and a bottom surface;
   a piezoelectric thin film formed on the top surface of said substrate; and
   thin film electrodes formed on the upper and lower surfaces of said piezoelectric thin film,
   wherein an alternating voltage is applied across said thin film electrodes to resonance said portion of said piezoelectric thin film,
   wherein a portion of said substrate under said piezoelectric thin film is partially or entirely removed to form a recess, said recess being opened to air at the top surface of said substrate, and
   wherein said device further includes at least one bridge supported at one end thereof on at least said piezoelectric thin film, said thin film electrode, or an insulating film formed between said substrate and said piezoelectric thin film and the other end thereof on at least a portion of said substrate outside said recess, wherein said portion to be resonated is supported by said bridge.

2. The piezoelectric thin film device according to claim 1, wherein said recess is opened to air at said top and bottom surfaces of said substrate.

3. The piezoelectric thin film device according to claim 2, wherein said device includes one or more said thin film electrodes on said piezoelectric thin film.

4. The piezoelectric thin film device according to claim 2, wherein said bridge makes an electrical connection between either or both of said thin film electrodes provided on opposite sides of said piezoelectric thin film and a portion of said substrate outside said recess.

5. The piezoelectric thin film device according to claim 1, wherein said recess is opened to air at only said top surface of said substrate.

6. The piezoelectric thin film device according to claim 5, wherein said device includes one or more said thin film electrodes on said piezoelectric thin film.

7. The piezoelectric thin film device according to claim 5, wherein said bridge makes an electrical connection between either or both of said thin film electrodes provided on opposite sides of said piezoelectric thin film and a portion of said substrate outside said recess.

8. The piezoelectric thin film device according to claim 1, wherein said device includes one or more said thin film electrodes on said piezoelectric thin film.

9. The piezoelectric thin film device according to claim 8, wherein said bridge makes an electrical connection between either or both of said thin film electrodes provided on opposite sides of said piezoelectric thin film and a portion of said substrate outside said recess.

* * * * *